(12) United States Patent
Wang et al.

(10) Patent No.: US 9,290,839 B2
(45) Date of Patent: *Mar. 22, 2016

(54) METHOD OF MAKING, AND, ANALYTE SENSOR

(71) Applicant: Abbott Diabetes Care Inc., Alameda, CA (US)

(72) Inventors: Yi Wang, San Ramon, CA (US); Timothy P. Henning, Vernon Hills, IL (US); Edmund T. Marciniec, Libertyville, IL (US)

(73) Assignee: Abbott Diabetes Care Inc., Alameda, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/314,306

(22) Filed: Jun. 25, 2014

(65) Prior Publication Data

US 2014/0318949 A1    Oct. 30, 2014

Related U.S. Application Data

(63) Continuation of application No. 12/907,345, filed on Oct. 19, 2010, now Pat. No. 8,795,477, which is a continuation of application No. 11/263,887, filed on Oct. 31, 2005, now abandoned.

(51) Int. Cl.
| | |
|---|---|
| *C23C 14/34* | (2006.01) |
| *C23C 14/06* | (2006.01) |
| *C23C 14/20* | (2006.01) |
| *H01M 4/88* | (2006.01) |

(52) U.S. Cl.
CPC ......... *C23C 14/3464* (2013.01); *C23C 14/0694* (2013.01); *C23C 14/205* (2013.01); *H01M 4/8885* (2013.01); *Y02E 60/50* (2013.01)

(58) Field of Classification Search
CPC .............. C23C 14/0694; C23C 14/205; C23C 14/3464; Y02E 60/50; H01M 4/8885
USPC .................................................... 204/192.17
See application file for complete search history.

(56) References Cited

U.S. PATENT DOCUMENTS

| | | |
|---|---|---|
| 3,082,144 A | 3/1963 | Haley |
| 4,199,412 A | 4/1980 | Battaglia et al. |
| 5,200,053 A | 4/1993 | Shimomura et al. |
| 5,213,675 A | 5/1993 | Yamaguchi et al. |
| 5,338,430 A | 8/1994 | Parsonage et al. |

(Continued)

FOREIGN PATENT DOCUMENTS

| | | |
|---|---|---|
| EP | 0393188 | 11/1988 |
| EP | 539954 | 5/1993 |

(Continued)

OTHER PUBLICATIONS

Belkdind et al., "Compositional and Morphological Analysis of AgCl Films Deposited by Evaporation and R.F. Sputtering, Thin Solid Films," vol. 142, pp. 113-125 (1986).

(Continued)

*Primary Examiner* — John Brayton
(74) *Attorney, Agent, or Firm* — Edward J. Baba; Bozicevic, Field & Francis LLP

(57) ABSTRACT

The subject invention provides conductive stripes, suitable for use as electrodes, and methods of making conductive stripes.

10 Claims, 7 Drawing Sheets

(56) References Cited

U.S. PATENT DOCUMENTS

| | | |
|---|---|---|
| 5,565,143 A | 10/1996 | Chan |
| 5,932,799 A | 8/1999 | Moles |
| 6,071,391 A | 6/2000 | Gotoh et al. |
| 6,120,676 A | 9/2000 | Heller et al. |
| 6,143,164 A | 11/2000 | Heller et al. |
| 6,175,752 B1 | 1/2001 | Say et al. |
| 6,299,757 B1 | 10/2001 | Feldman et al. |
| 6,338,790 B1 | 1/2002 | Feldman et al. |
| 6,461,496 B1 | 10/2002 | Feldman et al. |
| 6,484,046 B1 | 11/2002 | Say et al. |
| 6,546,269 B1 | 4/2003 | Kurnik |
| 6,551,494 B1 | 4/2003 | Heller et al. |
| 6,560,471 B1 | 5/2003 | Heller et al. |
| 6,565,509 B1 | 5/2003 | Say et al. |
| 6,576,101 B1 | 6/2003 | Heller et al. |
| 6,579,690 B1 | 6/2003 | Bonnecaze et al. |
| 6,591,125 B1 | 7/2003 | Buse et al. |
| 6,592,745 B1 | 7/2003 | Feldman et al. |
| 6,607,658 B1 | 8/2003 | Heller et al. |
| 6,616,819 B1 | 9/2003 | Liamos et al. |
| 6,618,934 B1 | 9/2003 | Feldman et al. |
| 6,654,625 B1 | 11/2003 | Say et al. |
| 6,746,582 B2 | 6/2004 | Heller et al. |
| 6,749,740 B2 | 6/2004 | Liamos et al. |
| 6,764,581 B1 | 7/2004 | Forrow et al. |
| 6,801,041 B2 | 10/2004 | Karinka et al. |
| 6,805,780 B1 | 10/2004 | Ryu et al. |
| 6,932,894 B2 | 8/2005 | Mao et al. |
| 6,942,518 B2 | 9/2005 | Liamos et al. |
| 6,973,706 B2 | 12/2005 | Say et al. |
| 6,975,893 B2 | 12/2005 | Say et al. |
| 6,990,366 B2 | 1/2006 | Say et al. |
| 8,795,477 B2 * | 8/2014 | Wang .................. C23C 14/0694 204/192.15 |
| 2001/0032785 A1 | 10/2001 | Cha et al. |
| 2005/0186333 A1 | 8/2005 | Douglas |
| 2007/0131549 A1 | 6/2007 | Cai et al. |

FOREIGN PATENT DOCUMENTS

| | | |
|---|---|---|
| JP | H01-136060 | 5/1989 |
| JP | H02-193055 | 7/1990 |
| JP | H04-223256 | 8/1992 |
| JP | H05-142189 | 6/1993 |
| JP | 2003-121407 | 4/2003 |
| JP | 2004-221114 | 8/2004 |
| JP | 2005-256119 | 9/2005 |

OTHER PUBLICATIONS

Bousse et al., "Properties of Ag/AgCl Electrodes Fabricated with IC-Compatible Technologies," Sensors and Actuators, vol. 9, pp. 179-197 (1986).

Escoffier et al., "Plasma Chloriding of Thin-Film Silver," Journal of Electrochemical Society, vol. 149, No. 4, pp. H98-H102 (2002).

Escoffier et al., "Surface Modifications of Silver Thin Films Using Low Power Chlorine Plasmas," Electrochemical and Solid-State Letters, vol. 4, No. 12, pp. H31-H33 (2001).

Frenkel et al., "Ultrasound-Facilitated Transport of Silver Chloride (AgCl) Particles in Fish Skin," Journal of Controlled Release, No. 68, pp. 251-261 (2000).

Hiratsuka et al., "Integration of Microfabricated Needle-Type Glucose Sensor Devices With a Novel Thin-Film Ag/AgCl Electrode and Plasma-Polymerized Thin Film: Mass Production Techniques," Analyst, vol. 126, pp. 658-663 (2001).

Kim et al., "Enhancement of Physical and Chemical Properties of Thin Film Ag/AgCl Reference Electrode Using a Ni Buffer Layer," Sensors and Actuators B, vol. 97, pp. 348-354 (2004).

Suzuki et al., "An Integrated Three-Electrode System With a Micromachined Liquid-Junction Ag/AgCl Reference Electrode," Analytica Chimica Acta, vol. 387, pp. 103-112 (1999).

Yalcinkaya and Powner, "Technical Note: Ag/AgCl/Cl—Coated Silver-Stripe Reference Electrode," Medical Engineering Physics, vol. 19, No. 3, pp. 299-301 (1997).

Zhu et al., "Determination of Proteins at Nanogram Levels by Their Quenching Effect on Large Scattering of Colloidal Silver Chloride," Fresenius J Anal Chem, vol. 366, pp. 863-868 (2000).

\* cited by examiner

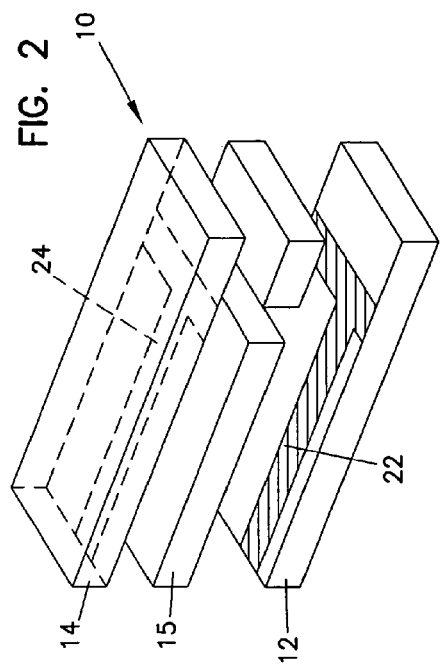
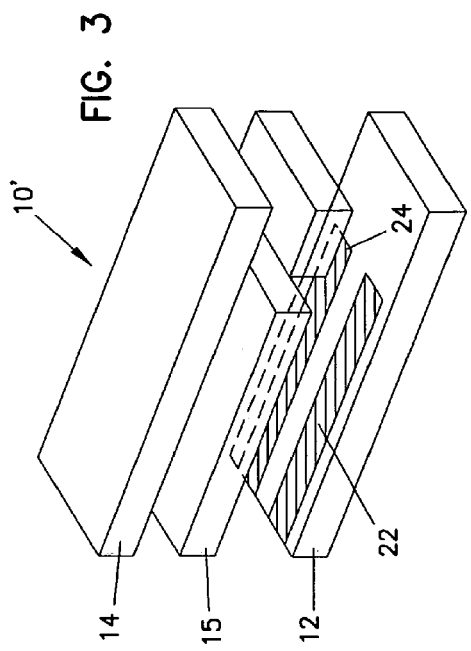
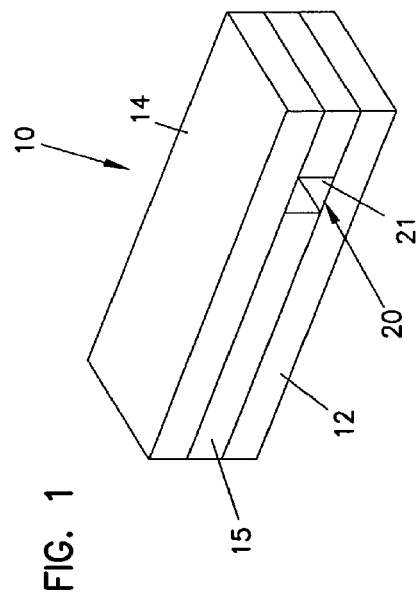
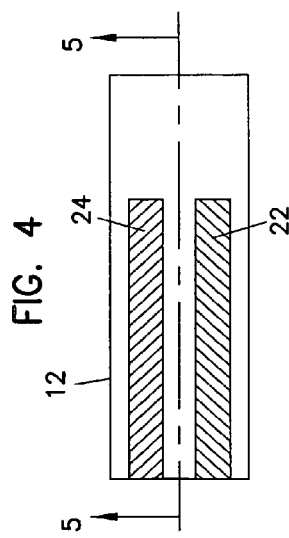

METHOD OF MAKING, AND, ANALYTE SENSOR

This application is a continuation of co-pending U.S. patent application Ser. No. 12/907,345, filed on Oct. 19, 2010, which is a continuation of U.S. patent application Ser. No. 11/263,887, filed on Oct. 31, 2005, which are incorporated herein by reference in their entirety.

FIELD OF THE INVENTION

This invention relates to analyte sensors.

BACKGROUND OF THE INVENTION

Electrochemical analytical sensors are commonly used to determine the presence and concentration of a biological analyte. Such sensors are used, for example, to monitor blood glucose levels in diabetic patients.

The measurement of glucose in blood at home by people with diabetes is important in the management of their disease. The blood glucose is measured using meters and sensors, which are typically thrown away after each use. Various designs of sensors are known. For example, U.S. Pat. Nos. 5,120,420, 5,437,999, 6,143,164, 6,338,790 and 6,616,819 disclose disposable electrochemical sensors with a layered construction having electrodes present on the substrates.

Simplified, the electrochemical glucose strip uses two electrodes to measure the amount of glucose in blood. Additional electrodes may also be incorporated into strip designs.

However, the electrochemical glucose strip requires a minimum of two electrodes to perform a measurement. One electrode is the working electrode where an electrochemical reaction takes place that is proportional to the amount of glucose in the blood. The glucose reaction usually involves an enzyme that reacts with glucose, such as glucose dehydrogenase or glucose oxidase, and an electrochemically active compound capable of reacting with the enzyme and at the working electrode. Current cannot flow through the measurement circuit of the glucose meter unless an electrochemical reaction equal in size, but in the opposite direction to that occurring at working electrode, may be made to occur at a second electrode also in fluid contact with the blood. This second electrode has been referred to as a counter electrode or a counter/reference electrode. As explained below, the counter electrode must function properly so that the working electrode may accurately respond to the glucose in the blood.

The current generated at the working electrode by the reaction of glucose with enzymes and mediators is the desired reaction. Electrons flow out of the mediator and into the working electrode. The mediator is oxidized at the working electrode. At the counter electrode, an equal number of electrons must flow out of the counter electrode and react with a reactive compound somewhere near or on the counter electrode. The reactive compound is reduced at the counter electrode. The reaction at the counter electrode must be capable of generating electrons faster than the reaction at the working electrode so the reaction at the counter does not slow down the reaction at the working electrode. The counter electrode also typically acts as a reference electrode. As a reference electrode, the electrical potential of the counter remains relatively constant even though the reduction reaction is occurring at the counter electrode. A constant potential is typically applied between the working electrode and counter electrode. The applied potential sets the energy level of the electrons within the working and counter electrodes. The energy level of the electrons determines what reactions may occur at each electrode. The potential applied by the meter between the working and counter electrodes typically remains constant throughout the glucose measurement. However the meter, to which the sensor is connected, may only control the difference in potential between the two electrodes. The absolute potential is therefore a function of the reactions that occur at the working and counter electrodes. It is therefore generally desirable that the counter electrode remains at a fixed potential so that the working electrode will also remain at a fixed potential.

There are two main methods used to fix the potential at the counter electrode. In some designs, a highly concentrated mediator solution is provided over the working and counter electrodes. The concentrated mediator dissolves in the blood applied to the glucose strip. The concentrated mediator will partially stabilize the potential of the counter electrode based on the ratio of the oxidized and reduced concentrations of the mediator. The potential of the counter may be calculated using the well know Nernst equation, which will not be explained here. As the oxidation reaction progresses at the working electrode, mediator is reduced at the counter electrode to complete the current circuit. As a result, the concentrations of oxidized and reduced mediator are changing at the counter and as a result the potential of the counter is changing. This method of constructing a counter electrode can, at best, form a quasi-reference electrode. The amount of mediator that has to be used is also very high because it must exceed the concentration needed for the oxidation reaction at the working electrode. Glucose in blood may approach 40 mM so typical mediator concentrations for this type of electrode is often over 100 mM. Many of the best mediator compounds are not soluble at high concentrations such as 100 mM so they cannot be used for this type of glucose strip construction. Most of the mediator ends up dissolved in the solution far away from the counter/reference electrode and serves no useful purpose. In this type of counter electrode, the shifting potential may be overcome by increasing the potential applied by the meter to compensate for any shift that may occur at the working and counter electrodes. Increasing the applied potential however bring the risk of reacting with electrochemically active interferences in the blood and generally results in poorer accuracy of the glucose measurement.

The one advantage to this type of glucose strip construction is that the same metal may be used for both the working electrode and the counter electrode. The mediator, in solution, needs to react equally well at both the working and counter electrodes so making them out of the same material is a good choice. Various currently available glucose sensors are made by coating sheets of plastic with pure metals, such as gold or palladium, and forming in the desired shapes of the working and counter electrodes. Despite the efficiency of manufacturing using only one metal, this type of manufacturing is limited to using highly soluble mediators to set the potential of the counter electrode and serve as a source of electrons to support the current needed at the working electrode.

Another common type of available counter electrode uses the solid and insoluble material silver chloride. The silver chloride may easily be reduced to silver providing a ready source of electrons to complete the reaction. Because the silver chloride is in the form of a solid, it is dense and contains a large amount of silver chloride per area. The silver chloride may be placed in close proximity to the counter electrode so it may react quickly as well as it is insoluble so nothing is wasted by dissolving in the blood sample and moving away from the counter electrode. Silver chloride is usually used in the presence of silver metal. Silver chloride and silver metal provide a stable fixed potential so the counter electrode serves as a good reference electrode. The common method of manufacturing the counter electrode is to use screen printing. Screen printing inks are sold that contain both silver and silver chloride. The silver is a good conductor of electricity but silver chloride is not. The counter electrode must pass current so the screen printing inks require a significant amount of silver to remain conductive. The amount of silver chloride must be restricted or the electrical resistance of the counter will become too high and resist the flow of the electrical current. Using a screen printed Ag/AgCl for the counter electrode does not involve the mediator in generating current at counter electrode. Because the mediator is not needed at the counter electrode, low concentrations of mediator may be used. Low solubility mediators that provide superior performance to high solubility mediators may be used in this design. Additionally, it is only necessary to place the mediator over the working electrode and not both electrodes, which saves in cost of the mediator and the complexity of the manufacturing process. In many ways the screen printed Ag/AgCl counter electrode is superior to the counter electrode made from gold that uses high levels of soluble mediator to function.

Since analyte monitoring, e.g., glucose monitoring, continues to be of importance, there continues to be interest in sensors and the manufacture of sensors.

SUMMARY OF THE INVENTION

This invention combines the manufacturing advantages of using sputtered metals with the superior performance of the Ag/AgCl counter electrode. This is accomplished by using sputtering to deposit metals and/or a reactive layer for the electrodes, such as a AgCl layer. The methods of making the reactive AgCl layer do not involve screen printing and are compatible with the manufacturing process used in the construction of the sputtered products. Using this invention, the advantages of using sputtered metals may be realized without giving up the superior performance of the screen printed Ag/AgCl counter electrode.

The present invention is directed to conductive materials and methods of applying conductive materials, e.g., for use as electrodes. More specifically, the present invention includes analyte sensors and methods of making analyte sensors, each sensor having at least one electrode and configured for determining the concentration of analyte in a biological fluid. In many embodiments, the sensor has at least two electrodes, one of the electrodes being a working electrode and the other being a counter electrode or a counter/reference electrode. Embodiments of the subject sensors include a multi-layered electrode having a first material layer overlayed with a second material layer. For example, a sensor may have a conductive stripe, which includes a conductive base layer, and a reactive layer over the conductive base layer. The reactive layer may include semi-conductive or insulative material. The conductive stripe is suitable for at least one of the sensor electrodes.

Also provided are methods of making electrodes, e.g., electrodes for use in analyte sensors. Embodiments of the subject methods include using a sputtering process to provide at least one electrode of the sensor, e.g., at least one layer of a multi-layer sensor such as the conductive base layer of the stripe and/or an overlayed reactive layer of the sensor.

In one aspect, a conductive base layer may be applied to a substrate of a sensor by sputtering. An example of a conductive base layer is silver (Ag), and another example is gold (Au).

In one aspect, a reactive material may be sputtered onto the conductive base layer. The reactive material may be composed of a single material or two or more different materials applied simultaneously, or, co-sputtered. An example of a reactive material that may be sputtered is AgCl, and another example of a reactive material that may be sputtered is a combination of Ag and AgCl.

In many embodiments, the reactive material(s) is insoluble in biological fluid, e.g., blood or interstitial fluid. For example, in certain embodiments, the reactive material may be provided to the substrate, e.g., overlayed on a base layer, in a first state such as a biological fluid-soluble state, which is then provided in a second state, such as a biological fluid-insoluble state. For example, the reactive material may be in a colloidal state when applied onto the conductive base layer. Upon curing or drying, the reactive material is insoluble in the biological fluid. An example of a colloidal reactive material is AgCl.

The analyte sensor according to the invention is configured for the analysis of concentration of analyte in a biological fluid sample. Sensors are one example of analytical sensors. Sensors have at least one working electrode and at least one counter electrode, which may be a counter/reference electrode. Sensors also may include optional reference electrode(s) and/or indicator electrode(s). A sample chamber, which receives the biological fluid sample, is a volume or area in which the sample is in contact with the electrodes.

The conductive stripe provided by the process of the present invention is suitable for any of the electrodes, and is particularly suited for a counter electrode of a sensor. For example, a silver/silver chloride electrode (Ag/AgCl) may be used as both a reference electrode to poise the potential of the sensor as well as a counter electrode that allows current to flow between it and the working electrode.

In one particular aspect, the invention is directed to a sensor and methods of making a sensor that has an electrode having a conductive base and an insoluble reactive layer on the conductive base. The conductive base layer may be formed by sputtering. The insoluble reactive layer may be formed by sputtering or from a colloid.

In another particular aspect, the invention is directed to a method of making an electrode, the method comprising sputtering a conductive layer on an inert substrate, and applying an insoluble reactive layer over the conductive layer. The insoluble reactive layer can be sputtered over the conductive layer, or could be applied as a liquid, such as a colloid. Two or more materials could be applied concurrently to form the reactive layer. If two or more materials are sputtered concurrently, this could be done by using a first target of a first material and a second target of a second material, or by using a target comprising the at least two materials, e.g., a first material and a second material.

In yet another particular aspect, the invention is directed to a method of making an electrode, the method comprising sputtering a conductive layer on an inert substrate, and then sputtering a reactive layer over the conductive layer. The reactive layer could have at least two materials, which are sputtered concurrently or sequentially. If concurrently sputtering a first material and a second material, this can be done by using a first target of a first material and a second target of a second material, or by using a target comprising a first material and a second material.

In yet another particular aspect, the invention is directed to a sensor comprising an electrode, the electrode comprising a conductive layer and an insoluble reactive layer over the conductive layer.

These and various other features which characterize the invention are pointed out with particularity in the attached claims. For a better understanding of the sensors of the invention and methods of making them, their advantages, their use and objectives obtained by their use, reference should be made to the drawings and to the accompanying description, in which there is illustrated and described preferred embodiments of the invention.

BRIEF DESCRIPTION OF THE DRAWINGS

Referring now to the drawings, wherein like reference numerals and letters indicate corresponding structure throughout the several views:

FIG. 1 is a schematic, perspective view of an electrochemical sensor in accordance with the principles of the present invention;

FIG. 2 is an exploded view of a first electrode configuration for the electrochemical sensor of FIG. 1;

FIG. 3 is an exploded view of a second electrode configuration for the electrochemical sensor of FIG. 1;

FIG. 4 is a top view of the first substrate of the sensor of FIG. 3;

DETAILED DESCRIPTION

Figure 5:
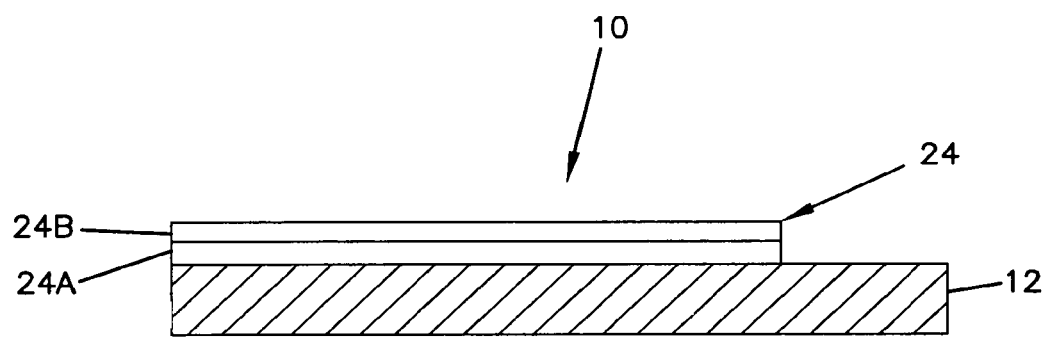
FIG. 5 is a cross-section view of taken along line 5-5 of FIG. 4.

When used herein, the following definitions define the stated term:

A "biological fluid" is any body fluid in which the analyte may be measured, for example, blood, interstitial fluid, dermal fluid, sweat, tears, and urine. "Blood" includes whole blood and its cell-free components, such as, plasma and serum.

A "counter electrode" refers to an electrode, used in conjunction with a working electrode, through which passes an electrochemical current equal in magnitude and opposite in sign to the current passed through the working electrode. The term "counter electrode" is meant to include counter electrodes which also function as reference electrodes (i.e. a counter/reference electrode).

An "electrochemical sensor" or "electrochemical sensor strip", and variations thereof, is a device configured to detect the presence of and/or measure the concentration of an analyte via electrochemical oxidation and reduction reactions. These reactions are transduced to an electrical signal that may be correlated to an amount or concentration of analyte.

"Electrolysis" is the electrooxidation or electroreduction of a compound either directly at an electrode or via one or more electron transfer agents (e.g., redox mediators and/or enzymes).

The term "facing electrodes" refers to a configuration of the working and counter electrodes in which the working surface of the working electrode is disposed in approximate opposition to a surface of the counter electrode.

An "indicator electrode" includes one or more electrodes that detect partial or complete filling of a sample chamber and/or measurement zone.

"Insoluble" means that the material, within about 10 minutes, does not substantially dissolve, disintegrate, break-up, disperse, decompose, or otherwise disappear upon exposure to biological fluid. It is understood that parameters such as temperature, pH, etc. and other factor may affect the solubility or insolubility of a material.

A "layer" includes one or more layers.

The term "planar electrodes" of "co-planar electrodes" refers to a configuration of the working and counter electrodes in which the working surface of the working electrode is disposed at least approximately planar to a surface of the counter electrode. "Planar electrodes" or "co-planar electrodes" are typically located on the same substrate.

A "reference electrode" includes a reference electrode that also functions as a counter electrode (i.e., a counter/reference electrode) unless the description provides that a "reference electrode" excludes a counter/reference electrode.

"Sputter", "sputtering" and variations thereof, includes deposition processes such as vacuum deposition, vapor deposition, thin film deposition, and the like.

A "thin" layer has a thickness of no greater than about 10 µm (100,000 Å), in some embodiment, no greater than about 1 µm (10,000 Å), and in some other embodiments, no greater than about 0.5 µm (5,000 Å).

A "working electrode" is an electrode at which analyte is electrooxidized or electroreduced with or without the agency of a redox mediator.

As summarizes above, embodiments of the present invention are directed to analyte sensors that include one or more electrodes having a first material layer and a second material layer thereon, e.g., a conductive base layer and a reactive layer (e.g., an insoluble reactive layer). The present invention also includes methods of making analyte sensors that include producing at least one electrode having two or more layers. For example, applying a first electrode material such as a conductive material to a substrate and applying a second electrode material such as a reactive material to the firstly applied materials. Methods may include sputtering a conductive base layer onto a substrate and then providing an insoluble reactive layer over the conductive base layer. As one example, the insoluble reactive layer may be sputtered onto the conductive base layer. As another example, the insoluble reactive layer may be applied as a colloid onto the conductive base layer. In some embodiments, the conductive base layer is a thin conductive base layer.

The reactive layer may be composed of one or more materials, where in some embodiments in which at least two materials are used, the at least two materials are homogenously mixed throughout the layer. The material(s) of the reactive layer may be conductive, semi-conductive, or insulating. In some embodiments, a conductive material may be combined with a non-conductive material, e.g., a semi-conductive material.

In one example, a sputtering process is used to provide a thin layer of silver (Ag) and silver chloride (AgCl) onto a base silver conductive layer, to form an area of conductive material, e.g., a conductive stripe. The conductive area, and particularly a conductive stripe, are suitable for use as an electrode in a sensor, e.g., an electrochemical sensor.

Referring to the Drawings in general and FIGS. 1 and 2 in particular, a first embodiment of a sensor 10 in the form of a strip is schematically illustrated. Sensor 10 has a first substrate 12, a second substrate 14, and a spacer 15 positioned therebetween. Sensor 10 includes at least one working electrode 22 and at least one counter electrode 24. At least one of electrodes 22, 24 may be a conductive stripe applied onto substrate 12, 14, respectively, according to the present invention. A second embodiment of a sensor 10' is illustrated in FIGS. 3 and 4. Sensor 10' also has first substrate 12, second substrate 14, spacer 15, working electrode 22 and counter electrode 24. FIG. 5 illustrates a cross sectional view of counter electrode 24, showing a conductive base layer 24A and an insoluble reactive layer 24B, as will be described in detail below.

Sensor 10, 10' is a layered construction, in certain embodiments having a generally rectangular shape, i.e., its length is longer than its width, although other shapes are possible as well.

The dimensions of a sensor may vary. In certain embodiments, the overall length of sensor 10, 10' may be no less than about 20 mm and no greater than about 50 mm. For example, the length may be between about 30 and about 45 mm; e.g., about 30 to about 40 mm. It is understood, however that shorter and longer sensors 10, 10' may be made. In certain embodiments, the overall width of sensor 10, 10' may be no less than about 3 mm and no greater than about 15 mm. For example, the width may be between about 4 and about 10 mm, about 5 to about 8 mm, or about 5 to about 6 mm. In one particular example, sensor 10, 10' has a length of about 32 mm and a width of about 6 mm. In another particular example, sensor 10, 10' has a length of about 40 mm and a width of about 5 min. In yet another particular example, sensor 10, 10' has a length of about 34 mm and a width of about 5 mm.

Substrates

As provided above, sensor 10, 10' has first and second substrates 12, 14 that are non-conducting, inert substrates which form the overall shape and size of sensor 10, 10'. Substrates 12, 14 may be substantially rigid or substantially flexible. In certain embodiments, substrates 12, 14 are flexible or deformable. Examples of suitable materials for substrates 12, 14 include, but are not limited to, polyester, polyethylene, polycarbonate, polypropylene, nylon, and other "plastics" or polymers. In certain embodiments the substrate material is "Melinex" polyester. Other non-conducting materials may also be used.

Spacer Layer

As indicated above, positioned between substrate 12 and substrate 14 may be spacer 15. Spacer 15 separates first substrate 12 from second substrate 14. Spacer 15 is an inert non-conducting substrate, typically at least as flexible and deformable (or as rigid) as substrates 12, 14. In certain embodiments, spacer 15 is an adhesive layer or double-sided adhesive tape or film. Any adhesive selected for spacer 15 should be selected to not diffuse or release material which may interfere with accurate analyte measurement.

In certain embodiments, the thickness of spacer 15 may be at least about 0.01 mm (10 μm) and no greater than about 1 mm or about 0.5 mm. For example, the thickness may be between about 0.02 mm (20 μm) and about 0.2 mm (200 μm). In one certain embodiment, the thickness is about 0.05 mm (50 μm), and about 0.1 mm (100 μm) in another embodiment.

Sample Chamber

The sensor includes a sample chamber for receiving a volume of sample to be analyzed; illustrated in FIG. 1, sensor 10, 10' includes sample chamber 20 having an inlet 21 for access to sample chamber 20. Inlet 21 may be in any suitable location, e.g., in addition to or instead of the position shown, inlet 21 may be positioned on a front side or end tip. Sample chamber 20 is configured so that when a sample is provided in chamber 20, the sample is in electrolytic contact with both the working electrode and the counter electrode, which allows electrical current to flow between the electrodes to effect the electrolysis (electrooxidation or electroreduction) of the analyte.

Sample chamber 20 is defined by substrate 12, substrate 14 and spacer 15; in many embodiments, sample chamber 20 exists between substrate 12 and substrate 14 where spacer 15 is not present. Typically, a portion of spacer 15 is removed to provide an area between substrates 12, 14 without spacer 15; this volume of removed spacer is sample chamber 20. For embodiments that include spacer 15 between substrates 12, 14, the thickness of sample chamber 20 is generally the thickness of spacer 15.

Sample chamber 20 has a volume sufficient to receive a sample of biological fluid therein. In some embodiments, such as when sensor 10, 10' is a small volume sensor, sample chamber 20 has a volume that may be no more than about 1 μL, for example no more than about 0.5 and also for example, no more than about 0.25 μL. A volume of no more than about 0.1 μL is also suitable for sample chamber 20, as are volumes of no more than about 0.05 μL and about 0.03 μL.

A measurement zone is contained within sample chamber 20 and is the region of the sample chamber that contains only that portion of the sample that is interrogated during the analyte assay. In some designs, the measurement zone has a volume that is approximately equal to the volume of sample chamber 20. In some embodiments the measurement zone includes 80% of the sample chamber, 90% in other embodiments, and about 100% in yet other embodiments. In certain embodiments, the measurement zone may be less than about 80% of the sample chamber.

Electrodes

As provided above, the sensor includes a working electrode and at least one counter electrode. The counter electrode may be a counter/reference electrode. If multiple counter electrodes are present, one of the counter electrodes will be a counter electrode and one or more may be reference electrodes. Referring to FIG. 2 and FIGS. 3 and 4, two examples of suitable electrode configurations are illustrated.

Working Electrode

At least one working electrode is positioned on one of first substrate 12 and second substrate 14 of sensor 10, 10'. In all of FIG. 2 though 4, working electrode 22 is illustrated on substrate 12. Working electrode 22 has a portion present in the area of sample chamber 20, and in some embodiments, includes a conductive trace that extends from the sample chamber to an end of the sensor, such as for connecting to a meter.

Working electrode 22 may be a layer of conductive material such as any suitable conductive material, e.g., gold, carbon, platinum, ruthenium dioxide, palladium, or other non-corroding, conducting material. Working electrode 22 may be a combination of two or more conductive materials. An example of a suitable conductive epoxy is ECCOCOAT CT5079-3 Carbon-Filled Conductive Epoxy Coating (available from W.R. Grace Company, Woburn, Mass.). The material of working electrode 22 typically has relatively low electrical resistance and is typically electrochemically inert over the potential range of the sensor during operation.

Working electrode 22 may be applied on substrate 12 by any of various methods, including the method of the present invention. Electrode 22 may be deposited, such as by vapor deposition or vacuum deposition or otherwise sputtered, printed on a flat surface or in an embossed or otherwise recessed surface, transferred from a separate carrier or liner, etched, or molded. Suitable methods of printing include screen-printing, piezoelectric printing, ink jet printing, laser printing, photolithography, and painting.

As provided above, at least a portion of working electrode 22 is provided in sample chamber 20 for the analysis of analyte, in conjunction with the counter electrode.

Counter Electrode

The sensor includes at least one counter electrode positioned within the sample chamber. In FIG. 2, counter electrode 24 is illustrated on substrate 14. In FIGS. 3 and 4, a counter electrode 24 is present on substrate 12. Counter electrode 24 has a portion present in the area of sample chamber 20, and in some embodiments, includes a conductive trace that extends from the sample chamber portion to an end of the sensor, such as for connecting to a meter.

Counter electrode 24 may be constructed in a manner similar to working electrode 22. The same materials and methods may be used to make counter electrode 24 as are available for constructing working electrode 22, although different materials and methods may also be used. Counter electrode 24 may include a mix of multiple conducting materials, such as Ag/AgCl and carbon.

In some embodiments, counter electrode 24 includes a conducting material and at least a second material, which may be non-conducting. The second material, in some embodiments, is a reactive material, meaning, that it facilitates the oxidation or reduction of the analyte in the biological fluid.

The conducting material and the optional second material may be present as individual layers or may be combined in a single layer. Suitable examples of constructions for the counter/reference or reference electrode include: an Ag base layer overcoated with AgCl; an Ag base layer overcoated with Ag combined with AgCl; or an Ag base layer overcoated with Ag combined with AgBr.

Referring to FIG. 5, an exemplary counter electrode 24 is particularly suited for being made in accordance with the present invention, i.e., a sputtered coated conductive base layer 24A on substrate 12 with an insoluble reactive layer 24B over the conductive layer. The insoluble reactive layer may also be sputtered.

Electrode Configurations

Working electrode 22 and counter electrode 24 may be disposed opposite to and facing each other to form facing electrodes. See for example, FIG. 2, which has working electrode 22 on substrate 12 and counter electrode 24 on substrate 14, forming facing electrodes. Working electrode 22 and counter electrode 24 may alternately be disposed generally planar to one another, such as on the same substrate, to form co-planar or planar electrodes. Referring to FIGS. 3 and 4, both working electrode 22 and counter electrode 24 occupy a portion of the surface of substrate 12, thus forming co-planar electrodes.

Sputtering of Conductive Base Layer, and Optionally, of Reactive Layer

At least one of electrodes 22, 24 may be a conductive area, e.g., a stripe, according to the present invention, that is, the electrode has a conductive base layer and an insoluble reactive layer, with the conductive base layer applied to the substrate by sputtering, described below. In one embodiment of the invention, the reactive layer is also applied by sputtering. Sputtering produces reproducible, thin, layers of materials; examples of suitable materials include, but are not limited to, carbon, gold, silver, copper, platinum, palladium, nickel, iridium, rhodium, ruthenium, cobalt, zinc, titanium, oxides of those materials, salts of those materials, and mixtures of any of these. For example, silver (Ag+) may be combined with a halogen (e.g., I−, Br−, Cl−, Fl−) to form, for example, AgCl. When desired, the mixed layer may have a homogeneous distribution of the two or more materials throughout the layer. It should be understood that although the discussion herein uses Ag and AgCl as examples, the invention is not limited to Ag and/or AgCl, but that any material that may be sputter coated may be used in the invention.

The sputtered layer, i.e., the conductive base layer and optionally the reactive layer, may be a thin layer having a thickness of no more than about 10 μm (100,000 Å), in some embodiments, no more than about 1 μm (10,000 Å), and in some other embodiments, no more than about 0.5 μm (5,000 Å). In some embodiments, the thickness is no more than about 0.2 μm (2,000 Å). An exemplary range for a sputtered layer is about 0.01 μm to about 0.02 μm (100 Å to 200 Å). Depending on the material being sputtered, the resulting layer is thin enough that it is almost transparent, if not transparent. In general, sputtered materials are insoluble in biological fluid; that is, within about 10 minutes, the sputtered material does not dissolve, disintegrate, break-up, disperse, decompose, or otherwise disappear upon exposure to biological fluid.

The conductive stripes according to the invention are particularly suited for electrodes of sensors. The cost of manufacturing electrodes by sputtering, compared to screen-printing, is reduced. Both the manufacturing process cost and the material costs are reduced using sputtering instead of screen-printing.

Manufacturing of multiple electrodes using a sputtering process offers many advantages over known processes. By sputtering the conductive base layer, and optionally one or more other layers thereon, such as at least a reactive layer, the cost of manufacturing may be reduced by avoiding conventional processing methods for sensor electrodes, which often include screen-printing and high temperature drying processes.

Prior electrochemical sensors have had electrode(s) made by screen-printing an ink or paste that contains one or two or more materials, such as silver and silver chloride. A silver/silver chloride electrode may be used as a counter electrode; see for example, U.S. Pat. No. 6,143,164, which discloses screen-printing a combination of Ag/AgCl. However, a screen-printed silver/silver chloride layer is hydrophobic and rough, both of which might impede the flow of fluid sample over the electrode. Also, in some embodiments, not all of the silver chloride in a screen-printed layer may be readily accessible for reaction, decreasing the reactivity of the layer, which may result in a decrease in the rate of analyte oxidation at the working electrode.

Additionally, depending on the process, screen-printing processes generally desire a high temperature drying process to cure the printed ink. Exposure to high temperatures also requires a high-temperature stable substrate material, which is generally more expensive than materials not stable at high temperatures. Sputtering, to make the conductive stripes of the present invention, may be performed at room temperature range, thus the non-heat stabilized less expensive substrate material may be used.

Although screen-printing and other forms of printing may produce electrodes with acceptable performance, a less expensive and more reproducible manufacturing process is desired. The present invention provides a conductive stripe that is suitable for use as an electrode for a sensor, e.g., a sensor strip.

As stated above, the conductive area or stripe according to the present invention, e.g., an electrode, has a sputtered conductive base layer overlaid by an insoluble reactive layer, which may be sputtered. Any metal or other material that may be applied via conventional sputtering processes may be used for the conductive stripe.

The sputter processes of the present invention may be used to apply the conductive base layer directly onto the substrate, e.g., substrate 12 or substrate 14 of sensor 10, 10'; no transfer or temporary substrate is needed. In some embodiments, an adhesion material may be provided on the substrate prior to sputtering of the base layer, to enhance the adhesive of the base layer to the substrate. Adhesion materials are selected based on the substrate and the base layer being sputtered. Example thicknesses of layers of adhesion material include about 50 to 100 μm, although thinner and thicker adhesions layers may be used.

Known configurations of equipment, chambers, power generators, vacuum system, inert gases, and other elements of sputtering systems may be used for the sputtering of the present invention. The methods of the present invention do not require any special or uncommon equipment, other than the targets, as will be described below. Suitable sputtering equipment includes multi-pass single chambers and one pass with a multi-chamber web-sputtering machine. Methods for the act of sputtering, that is, applying the layer, by adjusting sputtering power, sputtering yield, environment gases, etc., are well known in the art of sputtering.

As described above, the conductive stripe of the present invention includes a reactive layer over the conductive base layer; this reactive layer may be sputtered. As an example, according to the invention, a conductive base layer of silver metal may be sputtered onto a substrate, by using a silver target. Subsequently, a layer of silver chloride may be sputtered on top of the silver layer, by using a silver chloride target. Such a process provides a conductive stripe having two discrete layers, an Ag layer and an AgCl layer.

As another example, a conductive base layer of silver metal may be sputtered onto a substrate, by using a silver target. Subsequently, a reactive layer of Ag/AgCl may be sputtered on top of the silver layer, by using an Ag/AgCl target. Such a process provides a metal coating having two discrete layers, an Ag layer and an Ag/AgCl layer. Ag/AgCl targets, and other targets having a combination of materials, are described below.

Simultaneous Multiple Targets

To provide a sputtered layer having two or more materials, two or more different, and individual, targets may be used to apply a layer of mixed materials onto a substrate. The process applies material from each of the targets concurrently.

As an example, silver may be sputtered from a first target concurrently as AgCl is sputtered from a second target. Such a process provides a coating having a mixture of Ag and AgCl in one layer.

The ratio of the two materials in the resulting coating, e.g., Ag and AgCl, may be generally the same as the ratio of the surface areas of the two targets. For example, when used together, a silver target that has about 70 cm$^2$ exposed and an AgCl target that has about 30 cm$^2$ exposed, may provide a metal coating that has a ratio of about 70:30 Ag:AgCl, depending on the power applied to each target. The ratio of the two materials may be adjusted by taking into account the sputtering yield of each target material and adjusting the power applied to each target. The power ratio may alternately or additional be varied, during deposition, to obtain a transition from one material to the other, e.g., from pure silver to a mixture of silver and silver chloride, or to pure silver chloride.

Single Target

An alternate method to provide a sputtered layer having two or more materials, is to use two or more different materials combined to form a single target; this combined target is used to apply a single layer of mixed material onto a substrate.

The combination of two materials may be produced by providing, in the target, discrete area of each material. For example, plugs, strips, sections, or other shapes of the first material may be combined into a blank of the second material. Or, for example, strips, sections or other shapes of the first material could be combined with strips, sections or other shapes of the second material. For example, a circular Ag target, of about 30 cm in diameter, may have, e.g., ten, smaller targets of AgCl, e.g., about 3 cm in diameter, even spaced throughout the Ag target.

In some embodiments, the two materials are evenly positioned or distributed throughout the target. For example, a circular target may have equally spaced and sized portions; e.g., a target may have four pie-shaped quarters, two of each material, to provide a 1/1 (or 50/50) ratio of the two materials; e.g., a target may have eight pie-shaped sections, two of the first material and six of the second material, the two sections of the first material positioned opposite each other, to provide a 1/3 ratio of the two materials.

As an example, a target having areas of silver and AgCl is used to sputter a layer onto a substrate. Such a process provides a metal coating having a mixture of Ag and AgCl in one layer.

The ratio of the two materials in the resulting coating, e.g., Ag and AgCl, may be generally the same as the ratio of the surface areas of each of the materials in the target. For example, if the target has 70 cm$^2$ exposed Ag and 30 cm$^2$ exposed AgCl, the resulting coating with have a ratio of 70:30 Ag:AgCl.

Although specific ratios of 50/50 and 70/30 have been exemplified above, it is understood that layers having other ratios, e.g., 60/40, 20/80, etc., may be applied using methods of the present invention.

Figure 6:
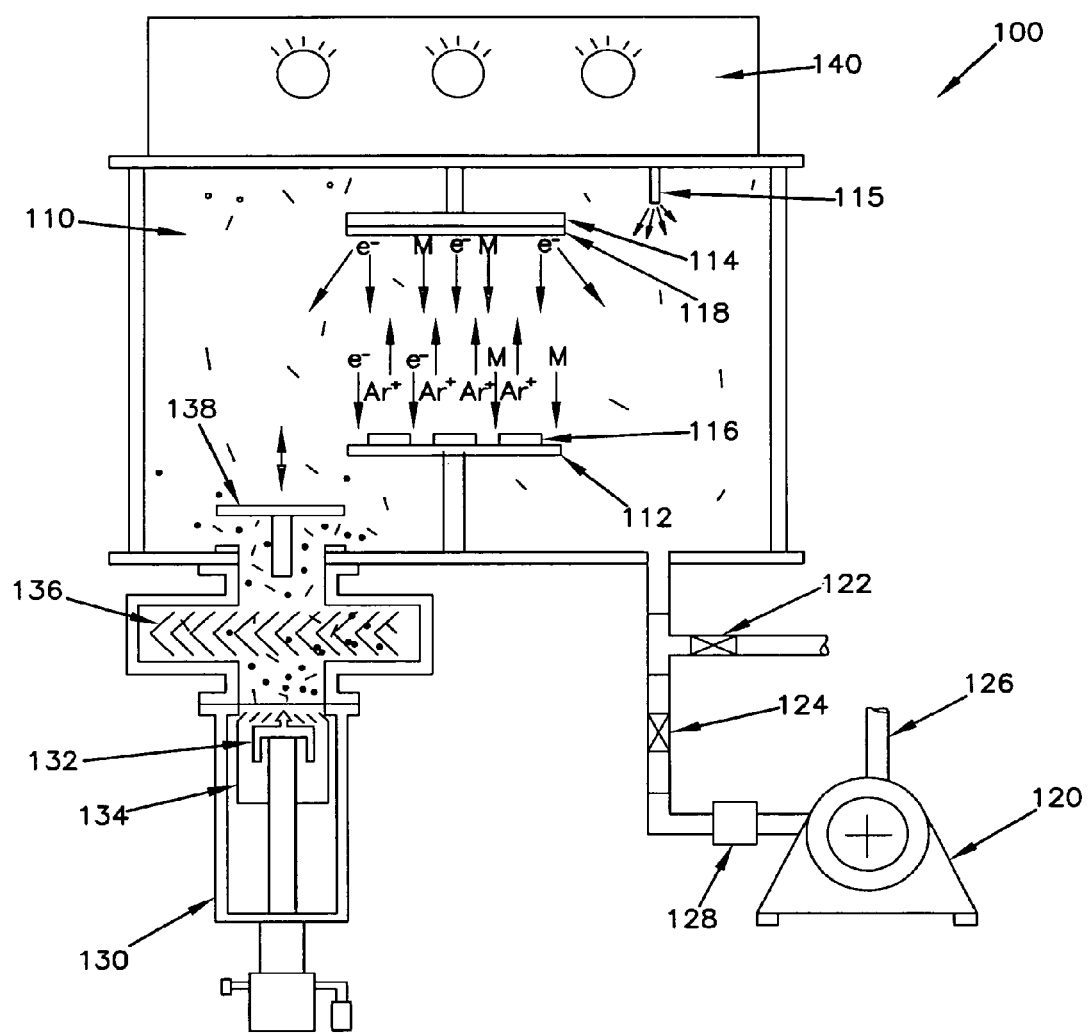
FIG. 6 is a schematic side view of a sputtering apparatus suitable for methods in accordance with the principles of the present invention.

Referring to FIG. 6, an embodiment of a sputtering apparatus is illustrated; it is noted that the apparatus is illustrated schematically. Apparatus 100 includes a vacuum chamber 110 into which the substrate to be coated is placed. As is well known in sputtering arts, apparatus 100 includes an anode 112 (having an overall + charge) and a cathode 114 (having an overall − charge). Anode 112 and cathode 114 are positioned to at least partially overlap one another, and are generally aligned with each other. The substrates to be coated 116 are positioned on anode 112 in opposite relation to cathode 114. Cathode 114 includes target 118, the material to be deposited onto substrate 116.

The various elements of apparatus 100 are known of the art of sputtering. For example, apparatus 100 includes an inlet 115 for providing an inert gas into vacuum chamber 110; an example of an inert gas is argon. An active gas or plasma may be used to facilitate the sputtering of one of the materials. For example, chlorine gas may be used to facilitate the sputtering of AgCl.

Apparatus 100 includes a vacuum system, which may include a mechanical pump 120 and appropriate piping and valves, for example, vent valve 122, roughing valve 124, exhaust pipe 126, and foreline trap 128.

Apparatus 100 also includes a high vacuum system, which are also known in the art of sputtering. Referring to FIG. 6, apparatus 100 includes a cryopump 130 having a first stage 132, a second stage 134, a cryotrap filled with liquid nitrogen 136, and a high vacuum valve 138. It is understood that alternate embodiments of sputtering apparatus may be used for the method of the present invention.

Figure 7:
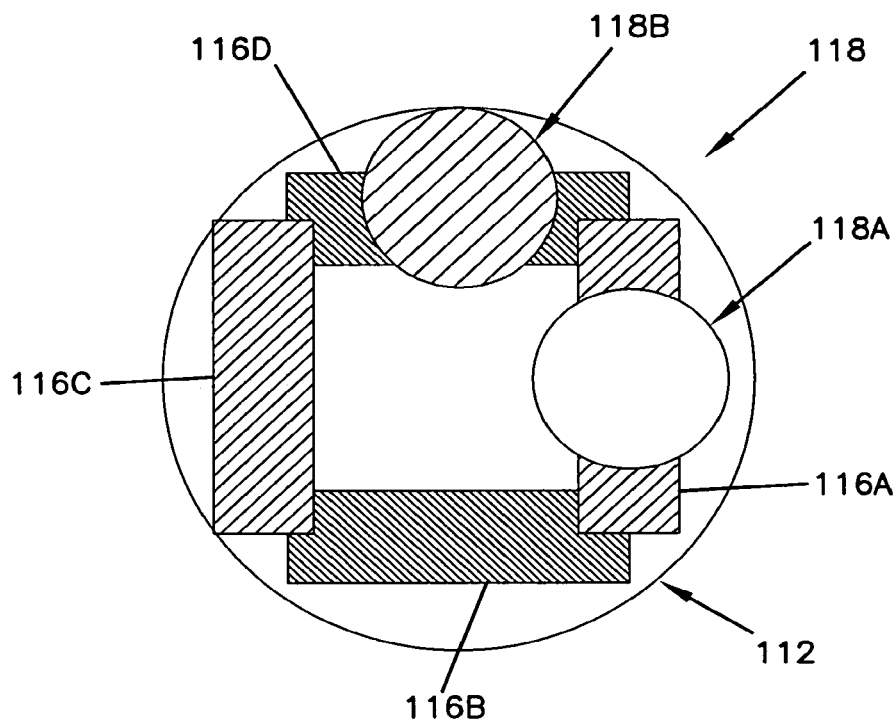
FIG. 7 is a schematic top view of the anode and cathode configurations of the apparatus of FIG. 6.
Figure 8:
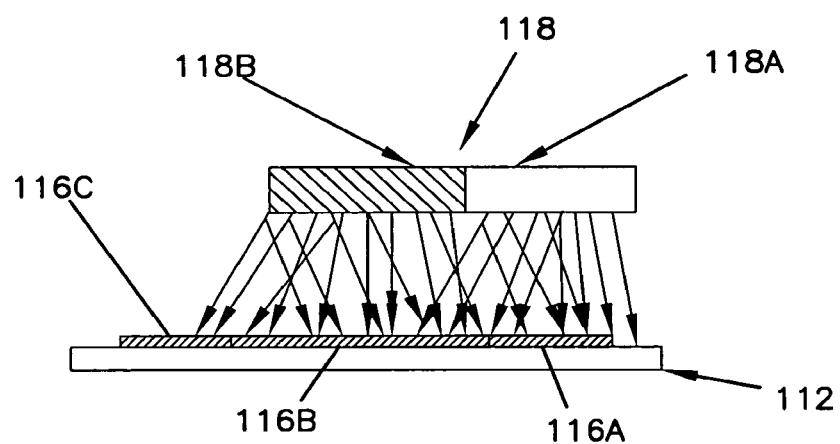
FIG. 8 is a schematic side view of the anode and cathode configurations of FIG. 7.

Referring now to FIGS. 7 and 8, one embodiment of a configuration according to the present invention is illustrated. Substrates 116 which are to be coated are positioned on anode 112. Anode 112 may include, for example, a rotating annular support, such as a table, onto which substrates 116 are positioned.

The sputtering may be done on one substrate 116 that is later converted (e.g., cut) to the desired final size, or, multiple substrates 116 may be coated in the same process, e.g., simultaneously. When positioned on the anode support, e.g., a rotating table, multiple substrates 116 may overlap each other, but any area of substrate 116 desired to be coated with the thin coating should be exposed.

Substrate 116 is coated with conductive material from target 118; in this particular embodiment of FIGS. 7 and 8, two separate targets, first sputtering target 118A and second sputtering target 118B, are used to simultaneously form a thin layer on four substrates 116A, 116B, 116C, 116D. For an embodiment having Ag/AgCl and Ag together and as the material to be deposited together, first target 118A includes the Ag/AgCl and second sputtering target 118B includes Ag. In the embodiment illustrated in FIG. 7, target 118A and target 118B have generally equal areas, which will result in a generally equal application of each of the materials onto substrates 116A, 116B, 116C, 116D. The ratio of the materials deposited will be directly proportionate to the ratio of the surface area of target 118A and target 118B.

Colloidal Insoluble Reactive Layer

The insoluble reactive layer may be applied over the conductive base layer as a colloid. As an example, an AgCl colloid may be applied over a 5000 Å thick sputtered silver layer, to provide a multi-layered Ag and AgCl conductive stripe. As a similar example, an AgCl colloid may be applied over a 3,000,000 Å (30,000 μm) thick sputtered silver layer, to provide a multi-layered Ag and AgCl conductive stripe. As yet another example, a colloidal Ag/AgCl layer may be applied over a sputtered gold (Au) conductive layer to provide a conductive stripe.

A colloid is a suspension of particulate in liquid, e.g., water; in a colloid, the particulate does not precipitate out. A colloidal material may be provided by mixing particulate material with liquid, e.g., water, and any optional ingredients, such as surfactants and other surface modifiers, viscosity modifiers, thickeners, and the like. Cellulose is an example of a suitable thickener. The colloidal material may be combined with other materials for application onto the conductive base layer; for example, the colloidal material may be combined with sensing chemistry, for an electrode.

The colloidal material is insoluble in biological fluid, e.g., blood and interstitial fluid; that is, the colloid, within about 10 minutes, does not dissolve, disintegrate, break-up, disperse, decompose, or otherwise disappear upon exposure to the biological fluid.

The colloid may be applied by various coating techniques, including die coating (e.g., with a slot die), extrusion coating, painting, striping, and the like. After coating, the thickness of the colloid layer typically decreases, due to the evaporation of the liquid from the material. For example, a coating applied at about 30 μm thickness might reduce to less than 5 μm. Heat and/or decreased pressure may be used to speed the drying.

Sensing Chemistry

If the conductive stripe is used as an electrode for a sensor, the stripe may include optional, sensing chemistry material(s) thereon, to aid the analysis of the analyte in the sample chamber. Sensing chemistry material facilitates the transfer of electrons between the electrode and the analyte in the sample. Any suitable sensing chemistry may be used for a sensor, and, the sensing chemistry may include one or more materials.

The sensing chemistry generally includes an electron transfer agent that facilitates the transfer of electrons to or from the analyte. The electron transfer agent may be diffusible or non-diffusible, and may be present the electrode as a layer. One example of a suitable electron transfer agent is an enzyme that catalyzes a reaction of the analyte. For example, a glucose oxidase or glucose dehydrogenase, such as pyrroloquinoline quinone glucose dehydrogenase (PQQ), may be used when the analyte is glucose. Other enzymes may be used for glucose or other analytes.

The electron transfer agent, whether it is diffusible or not, facilitates a current between the electrode and the analyte and enables the electrochemical analysis of molecules. The agent facilitates the transfer electrons between the electrode and the analyte.

The sensing chemistry may, additionally to or alternatively to the electron transfer agent, include a redox mediator, which may be diffusible or non-diffusible. Certain embodiments use a redox mediator that is a transition metal compound or complex. Examples of suitable transition metal compounds or complexes include osmium, ruthenium, iron, and cobalt compounds or complexes. In these complexes, the transition metal is coordinatively bound to one or more ligands, which are typically mono-, di-, tri-, or tetradentate. The redox mediator may be a polymeric redox mediator, or, a redox polymer (i.e., a polymer having one or more redox species). Examples of suitable redox mediators and redox polymer are disclosed in U.S. Pat. No. 6,338,790, for example, and in U.S. Pat. Nos. 6,605,200 and 6,605,201.

The redox mediator, whether it is diffusible or not, mediates a current between the electrode and the analyte and enables the electrochemical analysis of molecules which may not be suited for direct electrochemical reaction on an electrode. The mediator functions as an agent to transfer electrons between the electrode and the analyte.

Manufacture of the Sensors

The substrate, with the conductive layer and reactive layer present thereon, may be assembled into a sensor, such as an analytic sensor configured for the analysis of concentration of analyte in a biological fluid. Sensor strips are one example of analytical sensors. Sensors have at least one working electrode, at least one counter electrode, as discussed above, and may have optional reference electrode(s) and indicator electrode(s).

Sensors 10, 10', described above, are sandwiched or layered constructions having substrates 12, 14 spaced apart, such as by spacer 15. Substrates 12, 14 are joined after having electrodes 22, 24 and any optional indicator electrode(s) or reference electrode(s) applied. The conductive stripe of the invention is suitable for any of the electrodes, and is particularly suited for the counter electrode of a sensor, which often utilizes two or more metal materials. A silver/silver chloride electrode may be used as both a reference electrode to poise the potential of the sensor as well as a counter electrode that allows current to flow between it and the working electrode.

The conductive stripe, or any portion thereof, may be present in the desired configuration after sputtering or the stripe may be subsequently processed after sputtering or application to obtain the desired final shape. Laser energy may be used to remove unwanted portions of the layer to form the desired shape and size of the layer, e.g., the desired shape and size of an electrode.

The layered construction of sensors 10, 10' may be made by laminating the various layers together, in any suitable manner.

Application of the Sensor

A common use for the analyte sensor of the present invention, such as sensor 10, 10', is for the determination of analyte concentration in a biological fluid, such as glucose concentration in blood, interstitial fluid, and the like, in a patient or other user. Additional analytes that may be determined include, for example, acetyl choline, amylase, bilirubin, cholesterol, chorionic gonadotripon, creatine kinase, (e.g., CK- MB), creatine, DNA, fructosamine, glutamine, growth hormones, hormones, ketones, lactate, peroxide, prostate-specific antigen, prothrombin, RNA, thyroid stimulating hormone, and troponon. The concentration of drugs, such as, for example, antibiotics (e.g., gentamicin, vancomycin, and the like), digitoxin, digoxin, drugs of abuse, theophylline, and warfarin, may also be determined. Sensors 10, 10' may be available at pharmacies, hospitals, clinics, from doctors, and other sources of medical devices. Multiple sensors 10, 10' may be packaged together and sold as a single unit; e.g., a package of 25, 50, or 100 strips.

Sensors 10, 10' may be used for an electrochemical assay, or, for a photometric test. Sensors 10, 10' are generally configured for use with an electrical meter, which may be connectable to various electronics. A meter may be available at generally the same locations as sensors 10, 10', and sometimes may be packaged together with sensors 10, 10', e.g., as a kit.

Examples of suitable electronics connectable to the meter include a data processing terminal, such as a personal computer (PC), a portable computer such as a laptop or a handheld device (e.g., personal digital assistants (PDAs)), and the like. The electronics are configured for data communication with the receiver via a wired or a wireless connection. Additionally, the electronics may further be connected to a data network (not shown) for storing, retrieving and updating data corresponding to the detected glucose level of the user.

The various devices connected to the meter may wirelessly communicate with a server device, e.g., using a common standard such as 802.11 or Bluetooth RF protocol, or an IrDA infrared protocol. The server device may be another portable device, such as a Personal Digital Assistant (PDA) or notebook computer, or a larger device such as a desktop computer, appliance, etc. In some embodiments, the server device does have a display, such as a liquid crystal display (LCD), as well as an input device, such as buttons, a keyboard, mouse or touch-screen. With such an arrangement, the user may control the meter indirectly by interacting with the user interface(s) of the server device, which in turn interacts with the meter across a wireless link.

The server device may also communicate with another device, such as for sending analyte data from the meter and/or the service device to a data storage or computer. For example, the service device may send and/or receive instructions (e.g., an insulin pump protocol) from a health care provider computer. Examples of such communications include a PDA synching data with a personal computer (PC), a mobile phone communicating over a cellular network with a computer at the other end, or a household appliance communicating with a computer system at a physician's office.

A lancing device or other mechanism to obtain a sample of biological fluid, e.g., blood, from the patient or user may also be available at generally the same locations as sensors 10 and the meter, and sometimes may be packaged together with sensors 10 and/or meter, e.g., as a kit.

Sensors 10, 10' may be suited for inclusion in an 'integrated device', i.e., a device which has the sensor and a second element, such as a meter or a lancing device, in the device such, for example, as described in Applicant's co-pending U.S. patent application Ser. No. 10/701,993. The integrated device may be based on providing an electrochemical assay or a photometric assay. In some embodiments, sensors 10, 10' may be integrated with both a meter and a lancing device. Having multiple elements together in one device reduces the number of devices needed to obtain an analyte level and facilitates the sampling process.

For example, embodiments may include a housing that includes one or more of the subject strips, a skin piercing element and a processor for determining the concentration of an analyte in a sample applied to the strip. A plurality of strips 10, 10' may be retained in a cassette in the housing interior and, upon actuation by a user, a single strip 10, 10' may be dispensed from the cassette so that at least a portion extends out of the housing for use.

Operation of the Sensor

In use, a sample of biological fluid is provided to the sample chamber of the sensor, where the level of analyte is determined. In many embodiments, it is the level of glucose in blood that is determined. Also in many embodiments, the source of the biological fluid is a drop of blood drawn from a patient, e.g., after piercing the patient's skin with a lancing device, which may be present in an integrated device, together with the sensor.

Sensor 10, 10' may include an indicator electrode, which provides a signal when an adequate amount of fluid sample is present in sample chamber 20 to initiate the analyte level determination. The analyte is, e.g., electrooxidized or electroreduced at working electrode 22, and the level of current obtained at counter electrode 24 is correlated as analyte concentration. In general, the analysis of the sample may be by, for example, coulometry, amperometry, potentiometry or any combination thereof. The sensors may also be suitable for use with photometry.

Sensor 10, 10' may be operated with or without applying a potential to electrodes 22, 24. In one embodiment, the electrochemical reaction occurs spontaneously and a potential need not be applied between working electrode 22 and counter electrode 24. In another embodiment, a potential is applied between working electrode 22 and counter electrode 24.

EXAMPLES

The following non-limiting examples further illustrate the invention. All parts, percentages, ratios, etc., in the examples are by weight unless otherwise indicated.

Silver/silver chloride (Ag/AgCl) films were deposited in a sputtering system equipped with a liquid-nitrogen trap, at a rate of 1000 liters/sec, and a cryopump configured to obtain $2.0 \times 10^{-7}$ Torr. Two 20 cm diameter×0.64 cm thick, water cooled, targets were used, one 99.97% pure Ag and the second 99.9% pure AgCl. The sputtering was done in 99.999% pure Ar gas, at a flow rate of 20 $cm^3$/minute at a discharge pressure of $10 \times 10^{-3}$ Torr.

The target configuration for the Ag target was a DC Magnetron, and the AgCl target was a RF diode. The bias voltage during deposition, for the Ag and AgCl was –375 and 1150, respectively. The spacing between the targets and substrate was 6.25 cm. To maximize film uniformity, the grounded annular table was rotated at 2.5 revolutions per minute. Under these conditions, the film deposition rate was 180 angstroms/KW-minute.

Using the procedure described above, two examples of sputtered Ag/AgCl material were made.

The first example was made by sputtering a thin base layer (~500 Å) of Ag on a PET substrate, and then sputtering a layer (~1500 Å) of AgCl with an AgCl target over the first Ag layer.

The second example was made by sputtering a thin base layer (~500 Å) of Ag on a PET substrate, and then sputtering a layer (~1000 Å) of 70% Ag and 30% AgCl with both Ag and AgCl targets running at same time.

Both of these examples were combined with a printed carbon working electrode to make a glucose sensor. These sensors were tested and compared against control sensors made with printed Ag/AgCl reference/counter electrode. All test sensors were tested with same blood samples. The current profiles for the exemplary and comparative sensors were recorded for comparison.

Figure 9:
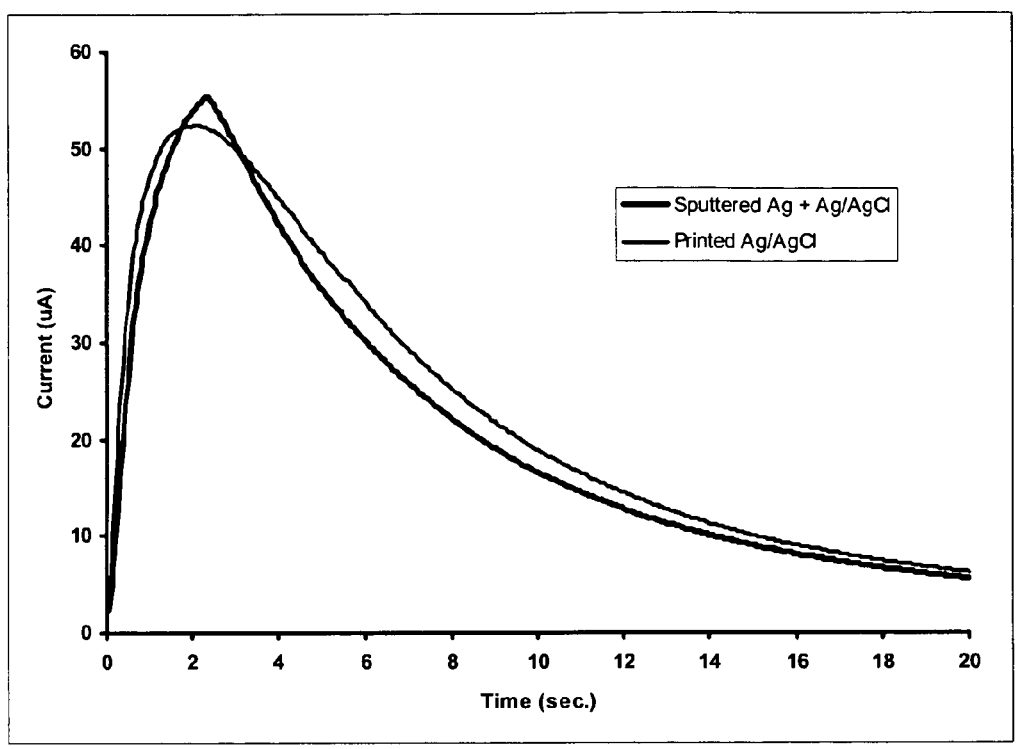
FIG. 9 is a graphical representation of a current profile for an electrode according to the present invention compared to a printed electrode.

The second counter electrode example, having the simultaneously sputtered Ag and AgCl on top of an Ag layer, performed very close to the control, i.e., the printed Ag/AgCl electrode. The current profile indicates that the sputtered Ag/AgCl reference/counter electrode recovered almost the same amount of charge as recovered by the printed Ag/AgCl electrode. As can be seen in FIG. 9, the current profiles for the sputtered electrode and the printed electrode are very similar. This shows that the performance of a sputtered Ag/AgCl electrode is very similar to the widely used printed Ag/AgCl electrodes.

Figure 10:
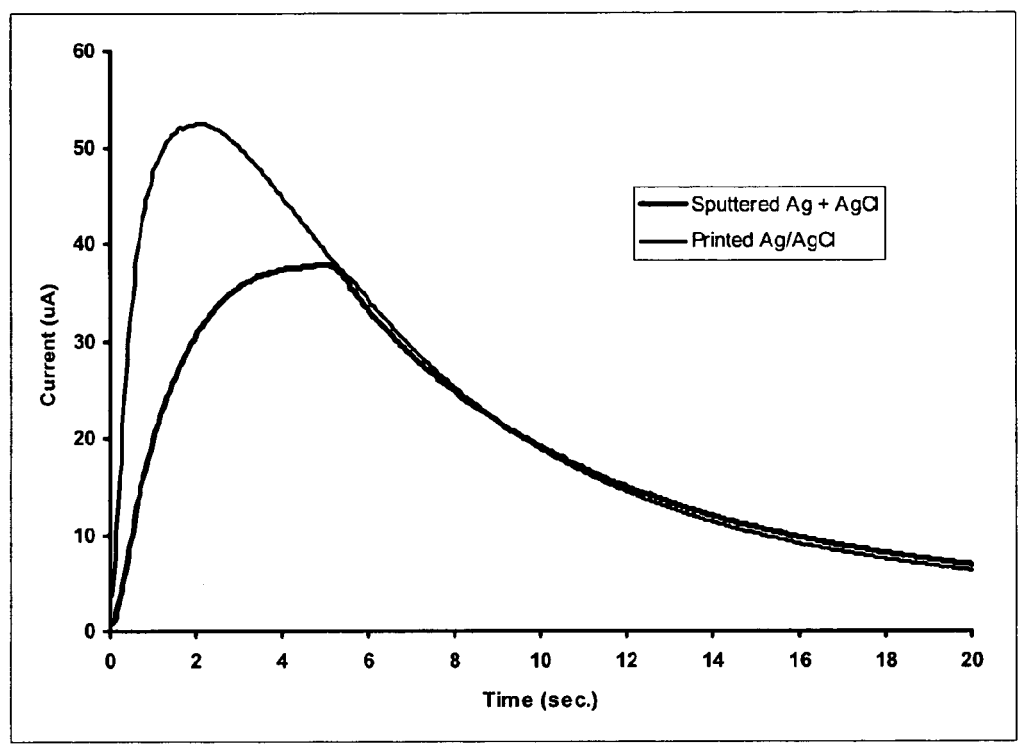
FIG. 10 is a second graphical representation of a current profile for an electrode according to the present invention compared to a printed electrode.

The first electrode example, sputtered AgCl on top of an Ag layer, recovered much less charge than the printed Ag/AgCl electrode. The peak current is somewhat limited. As can be seen in FIG. 10, there is a significant difference in the current profiles of the exemplary and comparative sensors.

As a third example, a counter electrode was made using a layer a colloidal silver chloride over a sputtered Ag layer. The colloidal AgCl was made by the following procedure.

A Solution A was made using the following ingredients: deionized water; solutions of 3% Dextrin (w/v) (from Sigma), 0.5% (w/v) Triton X100 surfactant (from Sigma), and 340 mM sodium chloride (from Fisher); 10 mM sodium phosphate buffer made from sodium hydrogen phosphate heptahydrate (from Sigma) and sodium dihydrogen phosphate monohydrate (from Aldrich), with approximate pH of 7.4; stock solution of 2 mM silver nitrate (from Sigma) (stored in an amber bottle to protect the solution from light exposure).

1.5 mL of Solution A was formed by adding in the following order 0.3 mL of sodium chloride stock solution, 0.3 mL of buffer solution, 0.3 mL of Dextrin stock solution, 0.45 mL of deionized water and 0.15 mL of Triton X100 stock solution. While stirring, 1.5 mL of silver nitrate stock solution was added to Solution A. The silver nitrate solution was added in 0.3 mL increments. Solution A immediately became cloudy upon the addition of the silver nitrate, which indicated the AgCl colloid was forming. The colloidal solution continued to become cloudier for approximately 1 hour, after which time it was considered ready for use. The colloidal solution was protected from light.

The colloidal AgCl solution was slot coated onto a sheet of plastic having a sputtered layer of silver (Ag) thereon. The colloidal solution was applied with syringe driven liquid dispenser (from Biodot) forming a counter electrode. Approximately 0.6 microliters of colloidal solution were dispensed for each sensor test strip made. The colloidal solution was dried onto the sheet by placing the sheet in a heated drier. A sheet of standard screen printed carbon working electrodes coated with glucose sensing chemistry was placed so it faced the colloidal AgCl on the counter electrode, thus providing a facing pair of electrodes. A 50 micrometer thick adhesive layer held the two substrates together. A region of the adhesive was absent to form a 0.3 microliter channel for application of a test analyte solution. The layered sheet was cut into individual glucose strips.

Figure 11:
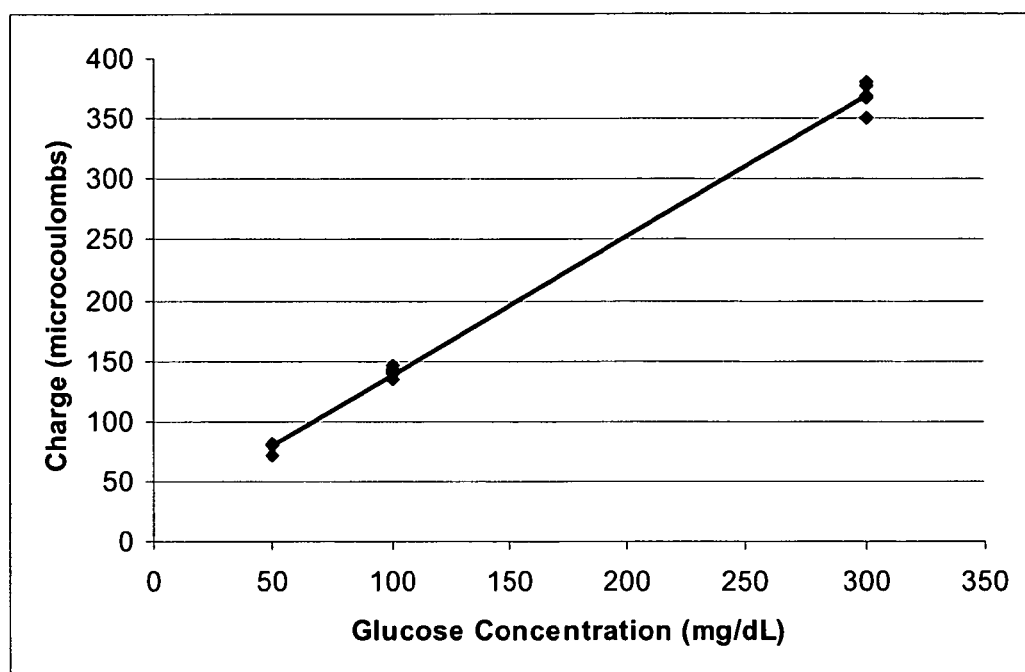
FIG. 11 is a graphical representation of test results for a colloidal electrode.

The resulting analyte sensor strips were tested using a laboratory test system that is applied 0 mV potential and measured the resulting current. The current was measured for 60 second and integrated to give a total charge for each strip. Six strips were tested at each of three glucose levels (50, 100 and 300 mg/dL) using aqueous control solutions. One outlier result at the high glucose level was omitted. FIG. 11 shows the data from the 17 sensor strips that were tested. The precision at each level is shown in the table below.

As seen in FIG. 11, the linearity and precision of the test results are good, which demonstrate that the colloidal silver chloride counter electrode produced a functional glucose strip.

| Glucose level (mg/dL) | Average charge (microcoulombs) | % CV |
| --- | --- | --- |
| 50 | 78.3 | 4.1 |
| 100 | 139.8 | 3.0 |
| 300 | 364.4 | 8.4 |

The invention has been described with reference to various specific and preferred embodiments and techniques. However, it will be apparent to one of ordinarily skill in the art that many variations and modifications may be made while remaining within the spirit and scope of the invention.

All patents and other references in this specification are indicative of the level of ordinary skill in the art to which this invention pertains. All patents are herein incorporated by reference to the same extent as if each individual patent was specifically and individually incorporated by reference.

What is claimed:

1. A method of making an electrode, the method comprising:
    applying a conductive layer onto a substrate; and
    simultaneously sputtering silver from a first target and silver chloride or silver bromide from a second target over the conductive layer to produce an insoluble layer comprising the silver and silver chloride or silver bromide, and
    wherein the first target and the second target are different.

2. The method of claim 1, wherein the applying comprises applying a conductive layer having a thickness of between 100 to 2000 angstroms.

3. The method of claim 1, wherein the applying comprises sputtering the conductive layer.

4. The method of claim 1, wherein the first material is silver and the second material is silver chloride.

5. The method of claim 1, wherein the ratio of the first material to second material ranges between 20:80 and 80:20.

6. The method of claim 5, wherein the ratio of the first material to the second material is 30:70.

7. The method of claim 1, wherein the method further comprises forming a second electrode comprising another conductive layer and the method further comprises applying sensing chemistry to the second electrode.

8. The method of claim 7, wherein the sensing chemistry comprises an analyte responsive enzyme and a mediator.

9. The method of claim 1, further comprising providing an adhesion material on the substrate prior to sputtering of the conductive layer.

10. The method of claim 1, wherein the conductive layer is carbon, gold, or silver.

* * * * *